United States Patent
Park

(10) Patent No.: US 6,566,949 B1
(45) Date of Patent: *May 20, 2003

(54) HIGHLY LINEAR HIGH-SPEED TRANSCONDUCTANCE AMPLIFIER FOR GM-C FILTERS

(75) Inventor: Joshua C. Park, Medford, MA (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 125 days.

(21) Appl. No.: 09/653,004

(22) Filed: Aug. 31, 2000

(51) Int. Cl.[7] ............................................... H03F 3/45
(52) U.S. Cl. .................. 330/252; 330/260; 330/292; 330/300; 330/303
(58) Field of Search ................ 330/252, 260, 330/292, 300, 303

(56) References Cited

U.S. PATENT DOCUMENTS

| | | | |
|---|---|---|---|
| 4,159,430 A | 6/1979 | Boudewijns et al. | |
| 4,216,435 A | 8/1980 | Ahmed | |
| 4,806,792 A | * 2/1989 | Simmons | 330/252 |
| 5,117,199 A | 5/1992 | Wang et al. | 330/252 |
| 5,283,483 A | 2/1994 | Laber et al. | 307/520 |
| 5,418,408 A | 5/1995 | Mangelsdorf et al. | 327/95 |
| 5,451,902 A | 9/1995 | Huang et al. | 330/253 |
| 5,463,348 A | 10/1995 | Sarpeshkar et al. | 330/253 |
| 5,465,072 A | 11/1995 | Atarodi | |
| 5,508,570 A | 4/1996 | Laber et al. | 327/563 |
| 5,510,738 A | 4/1996 | Gorecki et al. | 327/103 |
| 5,559,470 A | 9/1996 | Laber et al. | 330/252 |
| 5,574,678 A | 11/1996 | Gorecki | 364/807 |
| 5,581,212 A | 12/1996 | Huang et al. | 330/253 |
| 5,587,687 A | 12/1996 | Adams | 330/253 |
| 5,598,129 A | 1/1997 | Chambers | 330/255 |
| 5,617,064 A | 4/1997 | Gorecki | 333/22 R |
| 5,734,297 A | 3/1998 | Huijsing et al. | 330/253 |
| 5,815,012 A | 9/1998 | Rivoir et al. | 327/103 |
| 5,914,638 A | 6/1999 | He | 330/258 |
| 5,986,494 A | 11/1999 | Kimura | 327/359 |
| 6,002,708 A | 12/1999 | Fleming et al. | 375/200 |
| 6,023,196 A | 2/2000 | Ashby et al. | 330/290 |

FOREIGN PATENT DOCUMENTS

| | | | |
|---|---|---|---|
| GB | 2 064 250 | 6/1981 | |
| JP | 6077751 | * 3/1994 | 330/252 |

OTHER PUBLICATIONS

European Search Report dated Dec. 2001, No. EP01306666, pp. 1–2.

* cited by examiner

*Primary Examiner*—Michael B Shingleton
(74) *Attorney, Agent, or Firm*—Connolly Bove Lodge & Hutz LLP.

(57) ABSTRACT

A transconductance amplifier and method for improving the phase response and linearity. A differential amplifier circuit receives differential signals for amplification on respective bases of input bipolar transistors. The transistors amplify a small signal received on the based connections to produce an amplified output current. The differential amplifier circuit is connected to load impedances which form a cascode transconductance amplifier output stage. Feedback transistors provide a feedback voltage from the emitters of each of the different bipolar transistors to the base, improving the linearity of the differential amplifier. Phase compensation is provided by cross coupling through first and second capacitors a portion of each individual differential signal component to the base connections of the differential amplifier input transistor.

10 Claims, 5 Drawing Sheets

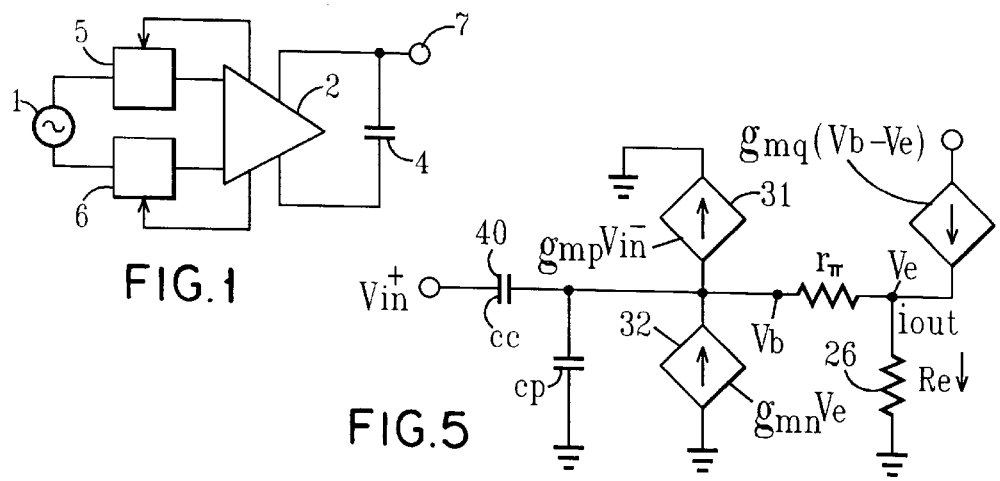
FIG. 1
FIG. 5
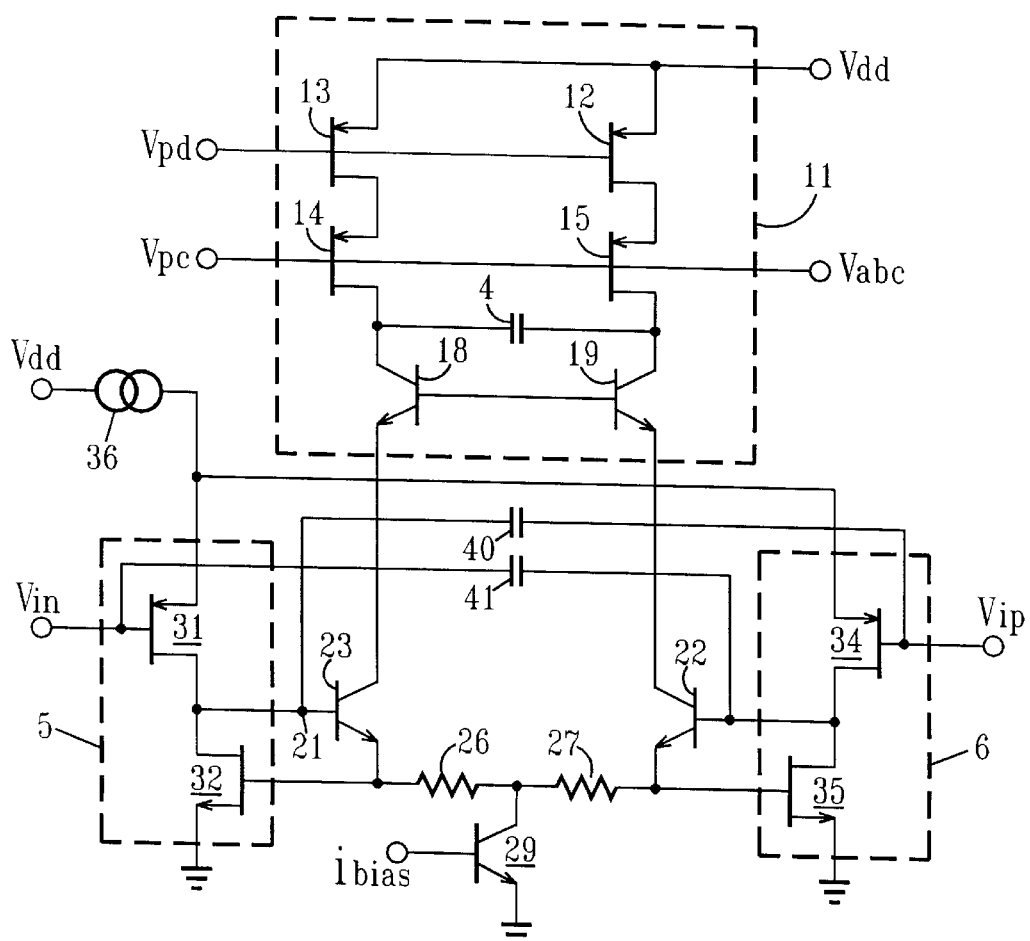
FIG. 4

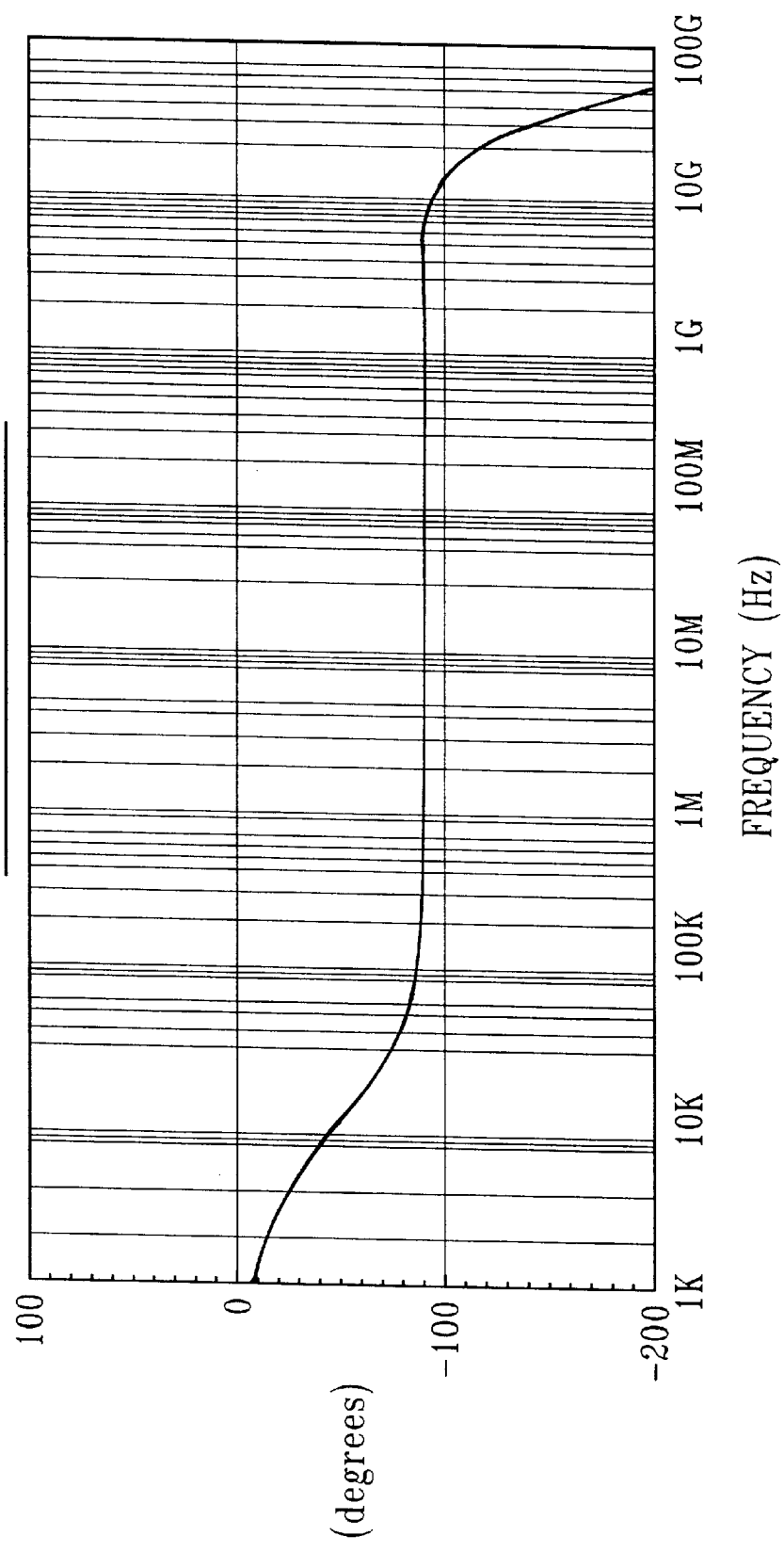
FIG.7 PHASE RESPONSE AFTER PHASE COMPENSATION

HIGHLY LINEAR HIGH-SPEED TRANSCONDUCTANCE AMPLIFIER FOR GM-C FILTERS

The present invention relates to transconductance amplifiers which are used in high frequency signal processing systems specifically, a transconductance amplifier having a linear amplified response and wide operational bandwidth is disclosed.

Solid state transconductance amplifiers are used as a basic circuit element for many types of signal processing devices. For instance, in the implementation of high order active filters, transconductance amplifiers may be used as an integrator. An ideal integrator provides a transfer function which is proportional to the gain of the transconductance amplifier and an integration capacitance terminating the output of the amplifier.

In order to implement signal processing devices such as high order active filters, the transconductance amplifier must provide a high degree of amplitude linearity over the frequency range of interest. Certain applications for processing signals in the 10 MHZ to 1GHZ frequency spectrum require a linearity of up to −80 dBc for third order intermodulation products (IM3) Additionally, to operate as an ideal integrator, the phase response for the transconductance amplifier terminated with an integration capacitor must be maintained at 90° over the bandwidth of interest. The requirement for a high linearity, and a flat phase response of substantially 90° over the bandwidth of interest, are particularly important when high order active filters requiring high linearity are implemented using such transconductance amplifiers.

BRIEF SUMMARY OF THE INVENTION

A highly linear and phase compensated transconductance amplifier implemented from a differential amplifier circuit is provided for by the invention. The differential amplifier circuit has first and second bipolar transistors which receive a differential signal for amplification. In order to improve the linearity of the gain response of the differential amplifier circuits, first and second input transistors comprise an input stage to each of the differential amplifier input transistors. The first and second input transistors supply one-half of the differential signal to a respective base of the differential amplifier circuit transistors, and provide feedback from the emitter of the respective differential circuit transistors to their respective bases. The effect is to improve the overall amplitude response linearity for the transconductance amplifier.

The phase of the resulting transconductance amplifier is compensated so that a phase response of 90° is maintained over the bandwidth of interest. First and second capacitors cross couple a portion of each half of the differential signal to the bipolar transistor which is receiving the other half of the differential signal. The first and second capacitors provide a pair of dominant poles in the frequency response of the transconductance amplifier, which dominates the pole produced from parasitic capacitances of the input transistors, and produce a pair of zeroes in the complex frequency plane which essentially cancels the resulting dominant poles. The compensated amplifier has a linear amplitude output and a relatively constant phase over the frequency range of interest.

BRIEF DESCRIPTION OF THE DRAWINGS

FIG. 1 represents a transconductor amplifier of a preferred embodiment used to implement an integrator in a high order active filter.

FIG. 4 represents a preferred embodiment of the invention having a linearized amplitude function and a compensated phase response.

FIG. 5 is the small signal equivalent circuit for the linearizing circuit 5.

FIG. 7 is the phase response of the transconductance amplifier of FIG. 4 which has been phase compensated.

DESCRIPTION OF THE PREFERRED EMBODIMENT

Referring now to FIG. 1, a functional block diagram is disclosed showing an integrator circuit which is used as an element for a high order active filter. The integrator comprises a transconductance amplifier 2 connected to an integrating capacitor 4. The signal to be integrated is applied to input terminal 1, which is connected to the input of the transconductance amplifier 2. The gain of the transconductance amplifier is gm, and the response of the integrator circuit may be represented as:

$$\frac{V_{out}}{V_{in}} = \frac{gm/c}{S}$$

where c is the value of the integrating capacitor and S is the S plane operator.

The idealized integrator of FIG. 1 should have a frequency response $W_o/S$, or in the frequency plane $W_o/j\omega$, and the phase response for the idealized integrator should be a continuous −90°, where $W_o$ is the unity gain frequency of the integrator.

Figure 2:
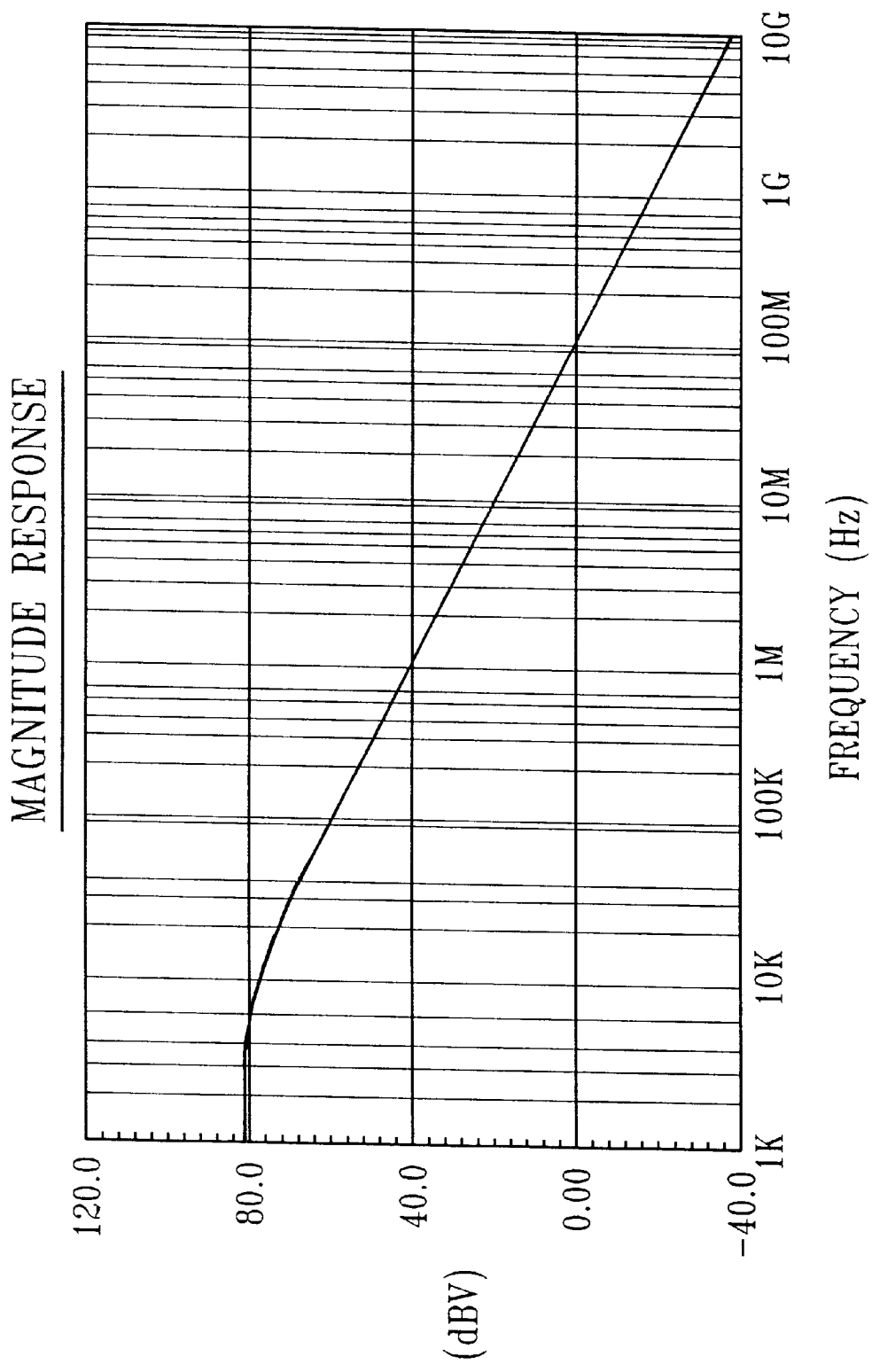
FIG. 2 illustrates the amplitude response of the uncompensated transconductance amplifier.
Figure 3:
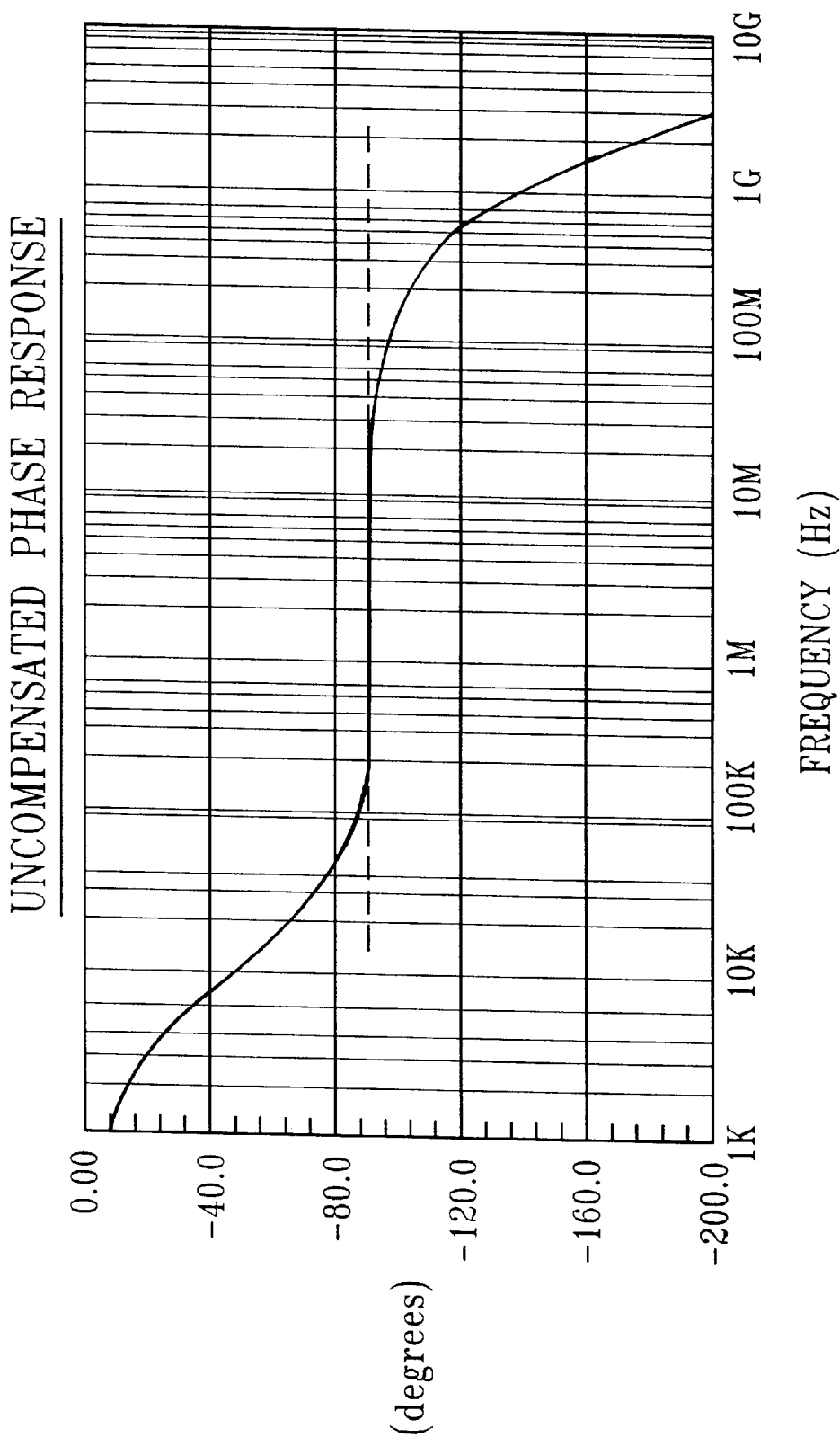
FIG. 3 represents the uncompensated phase response of a transconductance amplifier.

The transconductance amplifier 2 is selected as the gain element because, over the high frequency region of interest, ie. 10 MHZ–1GHZ, a wide operational bandwidth may be achieved. Improvements of linearity for small signal operation may be implemented by applying feedback to the input signals from each half of the differential amplifier 2 by boost circuits 5 and 6. While the resulting response provides a linear magnitude response as shown in FIG. 2, a phase response as set forth in FIG. 3 is obtained which is inadequate over the bandwidth of interest. The phase response is preferably a constant 90°, and any deviation from this idealized figure represented by the doted line in FIG. 3, reduces the total operational bandwidth for the integrator.

A more detailed illustration of the transconductance amplifier in accordance with the preferred embodiment is shown in FIG. 4. Referring now to FIG. 4, a basic differential amplifier is shown having bipolar input transistors 22 and 23, connected to a bipolar current source transistor 29 through emitter resistors 26 and 27. The gain of the amplifier is set by the values of resistors 26–27. The output stage of the differential amplifier is shown as 11. The output stage 11 provides a cascode output impedance, where PMOS transistors 12, 13, 14 and 15, operate in a saturation mode because of the bias voltage Vpc, and Vpb, applied to respective gates of these devices, which conduct a current from voltage supply Vdd. Bipolar transistors 18 and 19 similarly operate in the active mode under control of a bias potential Vabc to provide cascode output impedance for the differential amplifier.

The circuits 5 and 6 include input PMOS transistors 31 and 34 driven from a current source 36, and supply a differential signal component to the base of differential amplifier transistors 23 and 22. In order to provide the signal boost for linearizing the output of the differential amplifier, NMOS transistors 32 and 35 supply a feedback current from the emitters of bipolar transistors 22 and 23 to the base connections of bipolar transistors 22 and 23. The feedback forces the emitter voltage to linearly track input differential voltage, thus tending to further linearize the output currents produced from each of bipolar transistors 22 and 23 over an increased frequency bandwidth. Integrating capacitor 4 is connected between the collectors of transistors 22 and 23 which constitute the output terminals of the amplifier.

NMOS transistors 32 and 35 and PMOS transistor 31 and 34 of the linearizing boost circuits 5 and 6 introduce objectionable parasitic capacitance $C_p$ at their drain nodes between the base of transistors 23, 22 and ground. This results in a pole created in the complex frequency domains for the amplifier circuit, reducing the net effective operational bandwidth for the device.

Compensation of the parasitic capacitances produced by NMOS transistors 32 and 35 are provided by capacitors 40 and 41. Each of these capacitors cross couple a portion of the differential signal components applied to the transconductance amplifier, VIP and VIN, to the base of the respective bipolar transistors 23 and 22 which receive VIP and VIN. By cross coupling a portion of each differential signal component to the bipolar transistor 22, 23 amplifying the other differential component, a dominant pole is produced which dominates the pole produced by the parasitic capacitance $C_p$.

The foregoing effects are illustrated more particularly with respect to the small signal equivalent circuit of the linearizing circuit 5 shown in FIG. 5. The small signal equivalent circuit demonstrates an output current $i_{out}$ from the linearizing circuit which is produced from one-half of the differential amplifier current through bipolar transistor 23. The base resistance of transistor 23 is represented by $r_\pi$, and the transconduction of transistor 23 is $g_{mQ}$. The current through NMOS transistor 32, and PMOS transistor 31, are respectively:

$$i_{NMOS} = g_{mn} \cdot V_e$$

$$i_{PMOS} = g_{mp} \cdot V_{in}$$

where $g_{mn}$ is the transconductors of NMOS transistors 32, $g_{mp}$ is the transconductor of PMOS transistor 31, $V_e$ is the emitter voltage of transistor 23, $V_{in}$ is the differential signal component applied to the gate of PMOS transistor 31.

The small signal equivalent circuit demonstrates that there are two reactances, $C_c$ of capacitor 40, and $C_p$ of NMOS device 32. The small signal output current $i_{out}$ flowing through transistor 23 and the emitter degeneration resistor 26 can be written as follows:

$$i_{out} = \frac{g_{mp} + SC_c}{g_{mn} + S(C_c + C_p)} \cdot \frac{V_{in}}{R_e}$$

where $g_{mp}$ is the transconductance of PMOS transistor 31; $g_{mn}$ is the transconductance of NMOS transistor 32; $R_e$ is the emitter resistance 26 of bipolar transistor 23.

The transfer function of the small signal equivalent circuit includes a pole, located at $g_{mn}/(C_c+C_p)$. The effect of the compensation capacitor 40 is to produce a pole in the complex frequencies domain which dominates the pole produced by the parasitic capacitance $C_p$ of NMOS device 32. The dominant pole thus created is canceled by a substantially equivalent zero represented by.

$$\frac{g_{mp}}{C_c}.$$

Accordingly, the effects of the parasitic capacitance $C_p$ on the overall amplifier response are effectively neutralized.

Figure 6:
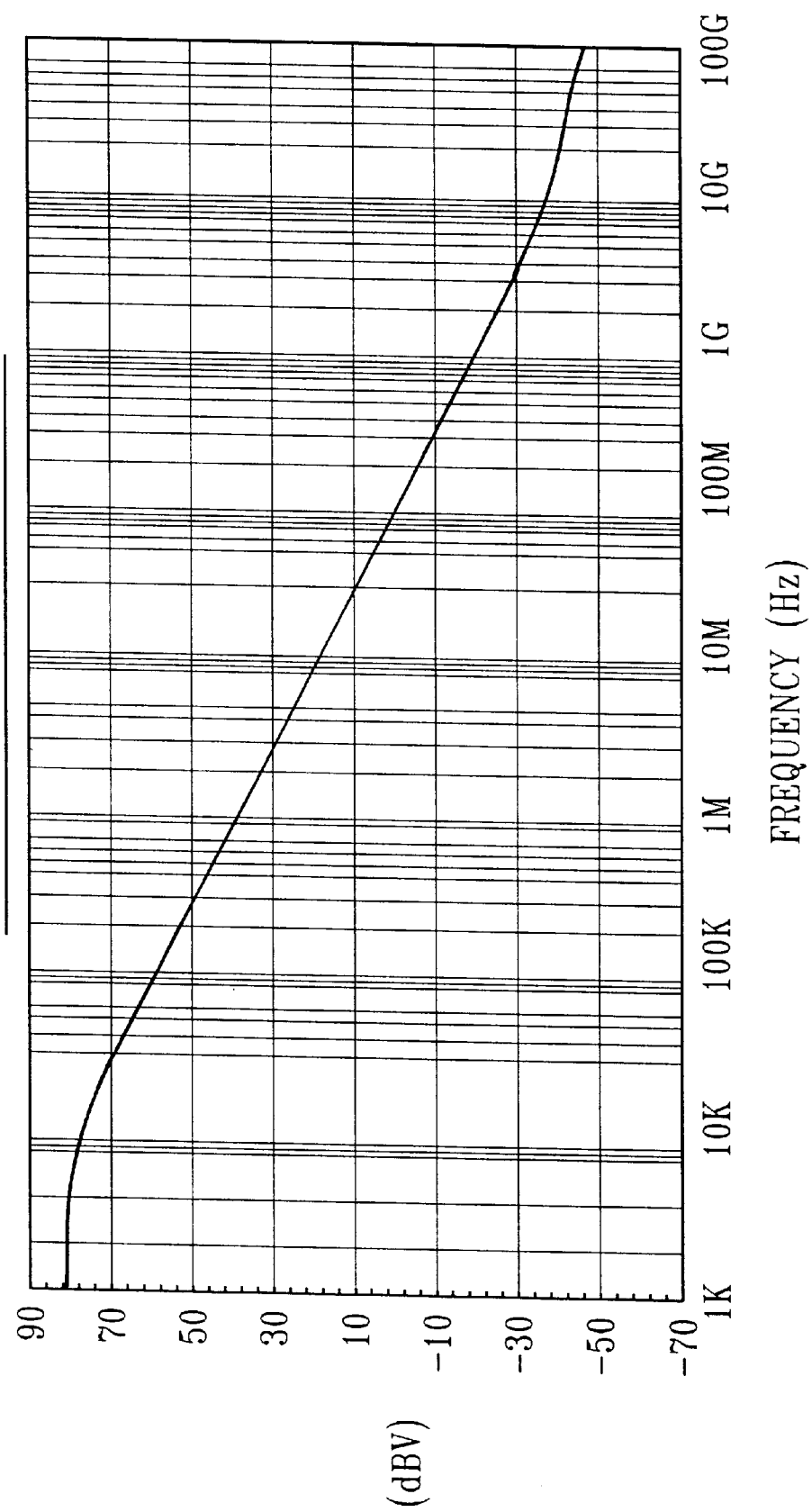
FIG. 6 is the amplitude response of the transconductance amplifier of FIG. 4 which has been phase compensated.

The amplitude response for the circuit which has been phase compensated and the compensated phase response are shown in FIG. 6 and FIG. 7. The linearity of the amplitude response has been maintained in FIG. 6, and the phase response has a constant phase of 90° over an increased bandwidth compared to the uncompensated phase response of FIG. 3.

A similar response is provided by the boost and linearizing circuit 6. Because of the presence of capacitor 41, a portion of the differential component signal VIN is cross-coupled to the base of the transistor 22 of the input differential amplifier which receives differential component VIP. A dominant pole is produced which is effectively canceled by a zero which was created at the same time.

Thus there has been described with respect to one embodiment of the invention, a transconductance amplifier having an improved linearity, and phase response.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A transconductance amplifier having an improved phase response and linearity, comprising:

a differential amplifier circuit having first and second bipolar transistors which receive a differential signal for amplification on respective bases of said differential transistors, said transistors having emitters connected to a source of emitter current through first and second resistors, and having collectors connected to first and second output impedances and to first and second output terminals;

first and second input transistors connected to receive a differential signal and to supply said differential signals to base connections of said first and second bipolar transistors;

first and second feedback transistors connected to provide a feedback voltage from said emitters to said bases, said feedback voltage improving the linearity of said differential amplifier; and a first capacitor connected to said first input transistor and to a base of said second bipolar transistor, and a second capacitor connected to said second input transistor and to the base of said first transistor, said first and second capacitors phase compensating the amplifier.

2. The transconductance amplifier according to claim 1 wherein said capacitors have a value which provides a zero for compensating a pole produced by a parasitic capacitance of said feedback transistors.

3. The transconductance amplifier according to claim 1 wherein said first input transistor has a drain source circuit serially connected with a drain source circuit of said first feedback transistor, and to a base of said first bipolar transistor, said second input transistor having a drain source circuit serially connected with a drain source circuit of said second feedback transistor and to a base of said second bipolar transistor, and said input transistors having gates for receiving said differential signal.

4. A transconductance amplifier having an improved amplitude linearity and phase response comprising:

a bipolar differential amplifier having first and second bipolar amplifying transistors, said amplifying transistors having emitter connections connected through first and second resistance elements to a source of current, and having collector load impedances connected to each collector of said transistors and to a supply voltage source;

first and second input stages having first and second inputs to receive a differential signal to be amplified, an output connected to a base of said first and second bipolar transistors, and feedback connection connected to receive a feedback signal from the emitter of a connected bipolar transistor which maintains said bases of said bipolar transistors at substantially the same potential as the emitters; and a first phase compensation capacitor connected from said first input for receiving a differential signal to the base of said second bipolar transistor, and a second phase compensation capacitor connected from said second input to receive a differential signal to base of said first bipolar transistor, said compensation capacitors effectively canceling the effects of parasitic capacitance produced by said first and second input stages.

5. The transconductance amplifier according to claim 4, wherein each of said first and second input stages comprises:

first and second field effect transistors having source-drain circuits connected in series with each other, forming an input terminal of said differential amplifier, said first transistor having a gate for receiving one-half of a differential signal, and said second field effect transistors having gates for receiving said feedback signal from said emitters.

6. The transconductance amplifier according to claim 5 wherein said capacitors create a pole which effectively dominates a pole created by a parasitic capacitance while simultaneously creating a zero which cancels the pole.

7. The transconductor amplifier according to claim 5 wherein said collector load impedances are selected to provide a cascode operation for the amplifier.

8. A method for improving the linearity and phase response of a transconductance amplifier comprising:

linearizing the amplitude response of a bipolar differential amplifier so that the base connection of each bipolar transistor is essentially at the same voltage potential as the voltage of the transistor emitter; and phase compensating said bipolar differential amplifier by capacitively cross coupling each half of an input differential signal to the base of a bipolar transistor of said differential amplifier which is coupled to the other half of said differential signal, whereby a pole produced by a parasitic capacitance across the output of said differential amplifier is effectively dominated by a pole which is created by said cross coupling capacitance and which is substantially canceled by a zero created by said cross coupling capacitors.

9. The method for improving linearity and phase response of a transconductance amplifier according to claim 8 wherein said step of linearizing the amplitude response comprises:

applying said differential signals to said transistors' bases through a first field effect transistor serially connected to a current source; and controlling the signal amplitude applied to each of said transistors' bases using a second transistor connected in series with said first transistor and having a control gate connected to said transistors' emitters.

10. The method according to claim 9 further comprising:

controlling the gain of said amplifier by the amount of resistance in each of said differential transistors emitter circuits.

* * * * *